US012716964B2

(12) United States Patent
Suess et al.

(10) Patent No.: US 12,716,964 B2
(45) Date of Patent: Aug. 25, 2026

(54) ANOMALOUS HALL SENSOR AND ANOMALOUS HALL

(71) Applicant: Infineon Technologies AG, Neubiberg (DE)

(72) Inventors: Dieter Suess, Herzogenburg (AT); Johannes Guettinger, Lind ob Velden (AT); Armin Satz, Villach (AT); Sebastian Zeilinger, Vienna (AT)

(73) Assignee: Infineon Technologies AG, Neubiberg (DE)

( * ) Notice: Subject to any disclaimer, the term of this patent is extended or adjusted under 35 U.S.C. 154(b) by 207 days.

(21) Appl. No.: 18/771,305

(22) Filed: Jul. 12, 2024

(65) Prior Publication Data

US 2025/0044376 A1 Feb. 6, 2025

(30) Foreign Application Priority Data

Jul. 31, 2023 (DE) ........................ 102023120302.9

(51) Int. Cl.

*G01R 33/00* (2006.01)
*G01R 33/02* (2006.01)
*G01R 33/07* (2006.01)

(52) U.S. Cl.

CPC ..... *G01R 33/0005* (2013.01); *G01R 33/0206* (2013.01); *G01R 33/07* (2013.01)

(58) Field of Classification Search

CPC . G01R 33/0005; G01R 33/0206; G01R 33/07
See application file for complete search history.

(56) References Cited

U.S. PATENT DOCUMENTS

| | | | | |
|---|---|---|---|---|
| 10,663,535 B2 * | 5/2020 | Motz | .................. | G01R 33/0023 |
| 11,293,998 B2 * | 4/2022 | Hikichi | .............. | G01R 33/0088 |
| 2019/0377037 A1 * | 12/2019 | Wu | .................... | G01R 33/0052 |
| 2022/0107338 A1 * | 4/2022 | Guettinger | ......... | G01R 33/0029 |

FOREIGN PATENT DOCUMENTS

DE 102022208712 A1 3/2023

* cited by examiner

*Primary Examiner* — Reena Aurora
(74) *Attorney, Agent, or Firm* — Harrity & Harrity, LLP

(57) ABSTRACT

The present disclosure relates to an anomalous Hall sensor, including a Hall cross. The Hall cross includes a layer stack including a ferromagnetic layer. A first arm of the Hall cross formed in the layer stack extends in a first direction. A second arm of the Hall cross formed in the layer stack extends in a second direction perpendicular to the first direction. The anomalous Hall sensor includes a control circuit configured to apply current through the first arm and measure voltage across the second arm, and apply current through the second arm and measure voltage across the first arm. The anomalous Hall sensor further includes a processor configured to compute a component of an external magnetic field in a third direction perpendicular to the first and the second direction based on a combination of the measured voltages.

20 Claims, 7 Drawing Sheets

ANOMALOUS HALL SENSOR AND ANOMALOUS HALL

CROSS-REFERENCE TO RELATED APPLICATION

This application claims priority to Germany Patent Application No. 102023120302.9 filed on Jul. 31, 2023, the content of which is incorporated by reference herein in its entirety.

TECHNICAL FIELD

The present disclosure generally relates to the field of magnetic field sensing, and, more particularly to the field of 3-dimensional (3D) magnetic field sensing.

BACKGROUND

In magnetic field sensors, a small offset may be crucial to fully leverage the signal to noise ratio and reduce unwanted environmental dependencies. This may be especially true for the measurement of small signals such as earth magnetic fields in a compass application or high precision 3D magnetic sensing. Offset compensation techniques are well established for Hall based devices but are lacking for magneto-resistive devices that offer generally higher signal to noise ratio. Furthermore, to be able to measure fields in all three directions (x, y, z), separate dedicated devices for each direction are typically used that increase development and fabrication complexity and the size of the sensing circuitry.

In conventional 3D Hall sensors, three different sensitive elements are needed for detecting fields in all three directions. These sensors have limited signal to noise ratio but enable active offset compensation via spinning current techniques. Using Spin-Orbit Torque (SOT), the concept of a 3D magnetic field sensor with a single sensitive element has been presented in Li, Ruofan, et al. "A spin-orbit torque device for sensing three-dimensional magnetic fields," Nature Electronics 4.3 (2021): 179-184. However, there the employed domain wall may lead to noise and non-reproducible behavior. When due to large external magnetic fields the domain wall is annihilated from the sensor, the sensor response may be altered or even its functional behavior may be destroyed.

SOT can manifest in various systems, including magnetic materials and structures. When an electric current is passed through a heavy metal or a layered structure composed of different materials, a spin-orbit interaction or coupling can generate a torque on a magnetization of adjacent magnetic layers.

In a conventional Hall effect, when an electric current flows through a conducting material placed in a magnetic field perpendicular to the current, a transverse voltage known as the Hall voltage is induced across the material. This voltage is proportional to the product of the applied current, magnetic field strength, and a material-dependent parameter called the Hall coefficient. However, in materials with strong spin-orbit coupling and magnetization, such as ferromagnetic metals or magnetic semiconductors, an additional contribution arises due to the anomalous Hall effect (AHE). The AHE is related to the spin-dependent scattering of charge carriers within the material. It causes an asymmetry in the charge carrier trajectories, resulting in a deflection of the carriers and the appearance of an extra Hall voltage perpendicular to the applied current and magnetic field.

Thus, there may be a desire to improve spin-orbit torque devices or anomalous Hall sensors using the AHE.

SUMMARY

This need is addressed by apparatuses and methods in accordance with the independent claims. Possibly advantageous implementations are addressed by the dependent claims.

According to a first aspect, the present disclosure proposes an anomalous Hall sensor using the AHE. The anomalous Hall sensor includes a Hall cross. The Hall cross includes a layer stack including at least one ferromagnetic layer next to at least one further layer. There may be several possible implementations of the layer stack. A first arm of the Hall cross formed in the layer stack extends in a first direction. For example, the first direction may be referred to as x-direction. A second arm of the Hall cross formed in the layer stack extends in a second direction perpendicular to the first direction. For example, the second direction may be referred to as y-direction. The anomalous Hall sensor further includes a control circuit configured to apply current(s) through the first arm of the Hall cross and measure voltage(s) across the second arm of the Hall cross in response to the current(s) through the first arm. The control circuit is further configured to apply current(s) through the second arm of the Hall cross and measure voltage(s) across the first arm of the Hall cross in response to the current(s) through the second arm. The anomalous Hall sensor further includes a processor configured to compute a component of an external magnetic field in a third direction perpendicular to the first and the second direction based on a combination of the measured voltages. For example, the third direction may be referred to as z-direction.

Thus, the present disclosure proposes a spinning current technique for anomalous Hall sensors. By applying respective currents to the two arms of the Hall cross, the component of the external magnetic field in the third direction perpendicular to the first and the second direction may be determined.

The Hall cross may include a (e.g., rectangular, square-shaped, or cross-shaped) layered structure with four electrical contacts arranged in a cross-like pattern. The first arm of the Hall cross interconnects two of the four contacts in the first direction (e.g., x-direction), the second arm of the Hall cross interconnects the other two of the four contacts in the second direction (e.g., y-direction).

In some implementations, the control circuit is configured to apply first and second currents through the first arm of the Hall cross in opposite directions and measure respective first and second voltages across the second arm of the Hall cross in response to the respective currents. If the first direction is the x-direction, then the first and second currents may be currents in positive x-direction and negative x-direction. The control circuit may be further configured to apply third and fourth currents through the second arm of the Hall cross in opposite directions and measure respective third and fourth voltages across the first arm of the Hall cross in response to the respective currents. If the second direction is the y-direction, then the third and fourth currents may be currents in positive y-direction and negative y-direction. The processor may be configured to compute the component of the external magnetic field in the third direction (e.g., z-direction) based on a combination of the measured four voltages. For example, the combination of the measured four voltages may include a first difference of the third and fourth voltage and a second difference of the first and second voltage. In a particular implementation, the combination of the measured four voltages may correspond to a difference between the second difference and the first difference.

In some implementations, the processor is further configured to compute a component of the external magnetic field in the first direction (e.g., x-direction) based on a combination of the measured first and second voltages in response to the respective currents. For example, the processor may be configured to compute the component of the external magnetic field in the first direction (e.g., x-direction) based on a sum of the measured first and second voltages.

In some implementations, the processor is further configured to compute a component of the external magnetic field in the second direction (e.g., y-direction) based on a combination of the measured third and fourth voltages in response to the respective currents. For example, the processor may be configured to compute the component of the external magnetic field in the second direction (e.g., y-direction) based on a sum of the measured third and fourth voltages.

Thus, a 3D anomalous Hall sensor may be obtained.

In some implementations, the layer stack includes at least one conductive non-magnetic layer and the ferromagnetic layer formed on top of each other. For example, the conductive non-magnetic layer may include a heavy metal layer. Some examples of heavy metals which may be used in spin-torque devices include:

- Platinum (Pt): Platinum is a widely used heavy metal in spintronics due to its strong spin-orbit coupling and good electrical conductivity. It may be employed as a spin-current source or as a spin-sink layer in spintronic devices.
- Tantalum (Ta): Tantalum is another heavy metal that exhibits strong spin-orbit coupling and is utilized in spintronic applications. It may be used as a spin-sink layer in devices to efficiently absorb spin currents.
- Ruthenium (Ru): Ruthenium is a heavy metal that offers good spin-orbit coupling and is used in spintronic devices, particularly in magnetic tunnel junctions (MTJs) and spin-transfer torque devices.
- Palladium (Pd): While not as commonly used as platinum, palladium is another heavy metal that can generate spin currents due to its strong spin-orbit coupling. It has been investigated for its potential in spintronic applications.

Some examples of ferromagnetic materials which may be used in spin-torque devices include:

- Permalloy (NiFe): Permalloy, a ferromagnetic alloy of nickel and iron, may be employed in spin-torque devices due to its favorable magnetic properties, such as high saturation magnetization and low magnetic damping. It is often used as the free layer or the reference layer in spin-transfer torque magnetic random-access memory (STT-MRAM) and magnetic tunnel junctions (MTJs).
- Cobalt (Co) and Cobalt alloys: Cobalt and its alloys, such as CoFeB (Cobalt-Iron-Boron), may be utilized in spin-torque devices. They possess strong magnetic anisotropy and are commonly used as the reference layer in STT-MRAM and magnetic sensors.
- Rare-earth transition metal alloys: Certain rare-earth transition metal alloys, such as gadolinium iron garnet (GdIG), have been investigated for their use in spin-torque devices. These materials exhibit interesting magnetic and spintronic properties that can be advantageous for specific applications.

In spin-torque devices, a spin current may be injected from a heavy metal layer into a neighboring ferromagnetic layer. The spin current exerts a torque on a magnetization of the ferromagnetic layer, allowing for the control and manipulation of its orientation.

In some implementations, the layer stack includes a multilayer composed of a plurality of repetitions of a non-magnetic and a magnetic layer. Examples of non-magnetic materials which may be used in spin-torque devices include:

- Heavy metals: Heavy metals with strong spin-orbit coupling, such as platinum (Pt), tantalum (Ta), and ruthenium (Ru), may be used as spin-current sources or spin-sink layers in spin-torque devices. These materials efficiently generate or absorb spin currents and facilitate the transfer of angular momentum between the electron's spin and orbital motion.
- Insulators: Insulating materials, such as aluminum oxide ($Al_2O_3$) or magnesium oxide (MgO), may be used as tunnel barriers in magnetic tunnel junctions (MTJs). These insulating layers serve as electrical isolators between the magnetic layers while allowing for spin-dependent tunneling currents. The tunnel barrier properties, such as high resistance and low leakage current, are crucial for the device operation.

Examples of magnetic materials which may be used in spin-torque devices include:

- Ferromagnetic materials: Ferromagnetic materials, such as permalloy (NiFe) and cobalt (Co) alloys, are used as the magnetic layers in spin-torque devices. These materials possess a permanent magnetization and can be manipulated by spin currents. Ferromagnetic layers are often utilized as the free layer in spin-transfer torque magnetic random-access memory (STT-MRAM) or as the reference layer in magnetic tunnel junctions (MTJs).
- Antiferromagnetic materials: Antiferromagnetic materials, such as iridium manganese (IrMn), are used as pinning layers in spin-torque devices. These materials exhibit a unique magnetic order where neighboring magnetic moments align antiparallel. The antiferromagnetic pinning layer helps stabilize the magnetization orientation of the free layer and enhances the stability of the device.

The combination of non-magnetic and magnetic materials allows for efficient generation, manipulation, and detection of spin currents in spin-torque devices. The specific choice of materials depends on the desired functionality, performance requirements, and compatibility with the device architecture.

In some implementations, the layer stack includes a multilayer composed of a plurality of repetitions of a first non-magnetic layer (e.g., Ta), a magnetic layer (e.g., CoFeB), and a second non-magnetic layer (e.g., MgO).

In some implementations, the ferromagnetic layer is in-plane magnetized. The ferromagnetic layer may exhibit a permanent magnetization even in the absence of the external magnetic field and may be essential for manipulating the magnetization dynamics through the application of spin currents. In spin-torque devices, a spin current may be injected from a heavy metal layer into a neighboring ferromagnetic layer. The spin current exerts a torque on the magnetization of the ferromagnetic layer, allowing for control and manipulation of its orientation.

In some implementations, the ferromagnetic layer includes an out-of-plane multidomain state. In the context of spin-torque and spintronics, a multidomain state refers to the arrangement of magnetic domains within a magnetic layer in a spin-torque device. Spin-torque devices utilize spin currents to control the magnetization dynamics and switch the magnetization orientation of the magnetic layer. In a spin-torque device, a magnetic layer is typically composed of a ferromagnetic material, which exhibits a permanent magnetization. However, due to various factors such as the size, shape, and magnetic anisotropy of the magnetic layer, it may be divided into multiple magnetic domains. A multidomain state in a spin-torque device occurs when the magnetic layer includes multiple magnetic domains with different magnetization orientations. Each domain represents a region where the magnetization is aligned in a specific direction, but the domains may have distinct boundaries called domain walls. The presence of multiple magnetic domains affects the behavior of spin currents in the device. When a spin current is injected into a multidomain magnetic layer, it can exert torques on the domain walls and interact with the magnetization within each domain. This interaction can lead to domain wall motion, domain expansion or contraction, and changes in the overall magnetization state of the device.

In some implementations, the control circuit is configured to inject the currents into the arms of the Hall cross as spin-polarized currents, respectively. Spin-polarized currents refer to electric currents in which the individual electrons have a preferred spin orientation. In other words, the current carries a net spin polarization, meaning that there is an imbalance between the number of electrons with spin up and spin down, for example.

According to a further aspect, the present disclosure proposes anomalous Hall sensing method. The method includes applying current(s) through a first arm of a Hall cross extending in a first direction. For example, the first direction may be referred to as x-direction. The method includes measuring voltage(s) across the second arm of the Hall cross in response to the current(s) through the first arm. The method includes applying current(s) through the second arm of the Hall cross extending in a second direction perpendicular to the first direction. For example, the second direction may be referred to as y-direction. The method includes measuring voltage(s) across the first arm of the Hall cross in response to the current(s) through the second arm. Further, the method includes computing a component of an external magnetic field in a third direction perpendicular to the first and the second direction based on a combination of the measured voltages. For example, the third direction may be referred to as z-direction.

BRIEF DESCRIPTION OF THE DRAWINGS

Some examples of apparatuses and/or methods will be described in the following by way of example only, and with reference to the accompanying figures, in which.

DETAILED DESCRIPTION

Figure 1:
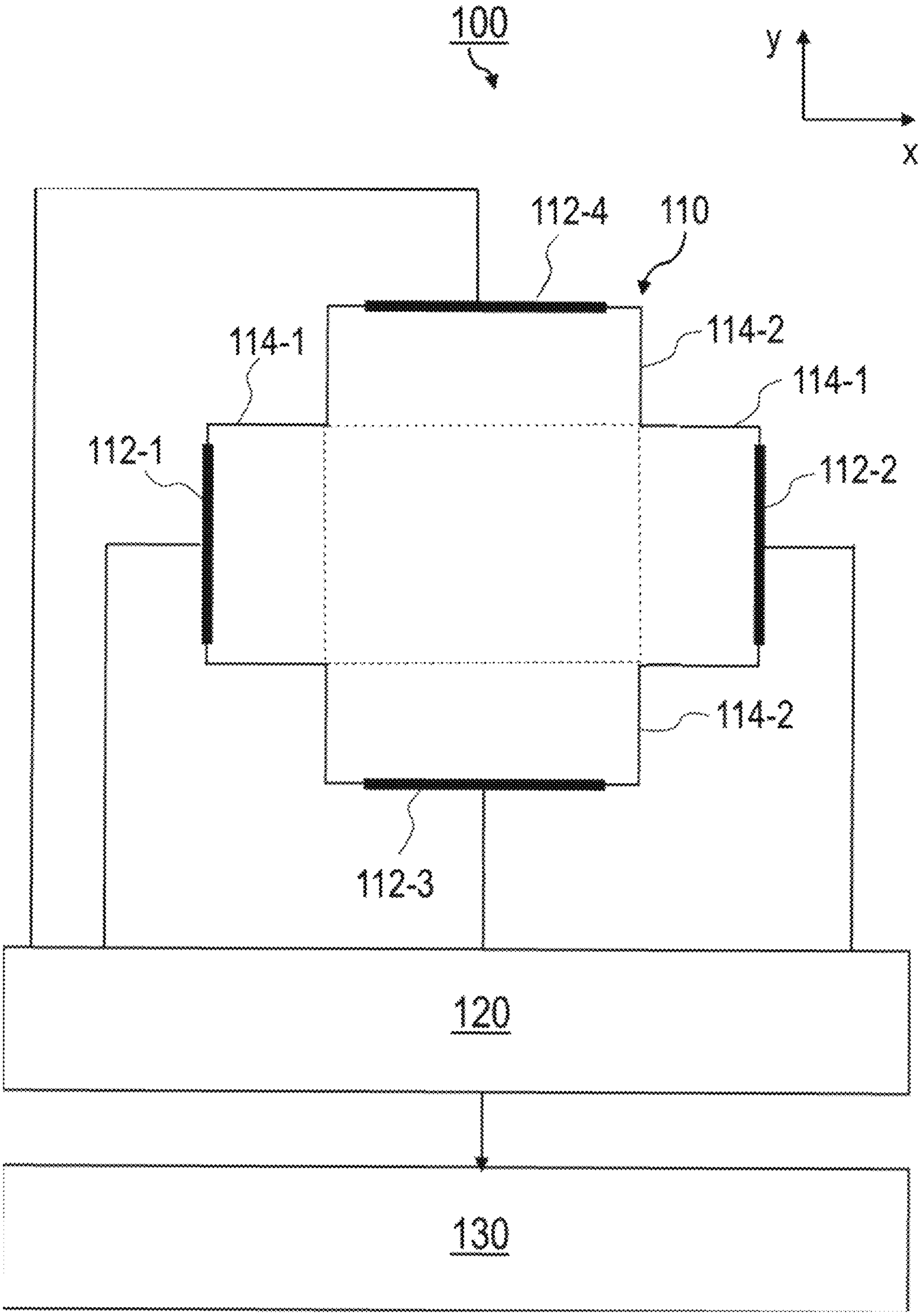
FIG. 1 illustrates an anomalous Hall sensor, in accordance with implementations of the present disclosure.

Some examples are now described in more detail with reference to the enclosed figures. However, other possible examples are not limited to the features of these implementations described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, e.g., only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates an anomalous Hall sensor 100 in accordance with implementations of the present disclosure. Anomalous Hall sensor 100 is a type of magnetic field sensor that utilizes the anomalous Hall effect to detect and measure magnetic fields.

When a non-ferromagnetic metallic sample is exposed to a perpendicular external magnetic field B, the Lorentz force acting on the current carriers gives rise to a transverse voltage in the plane of the sample. The transverse component of the resistivity, $\rho_{xy}$, depends on the magnetic field through the relationship $\rho_{xy}=R_0B$, where $R_0=1/(ne)$ is known as the Hall coefficient, n is the carrier density, and −e is the electron charge. This phenomenon, whose explanation is entirely classical, is known as the ordinary Hall effect and is well understood. Determining the Hall coefficient $R_0$ has become the tool of choice for measuring carrier densities in conducting materials.

Subsequently it was noticed that in many ferromagnets the transverse resistivity acquires an additional term independent of the magnetic field, which is often proportional to the magnetization M of the ferromagnetic sample, and becomes constant once the sample has reached its saturation magnetization. The effect is referred to as the anomalous Hall effect (AHE). Whereas the ordinary Hall effect of classical physics requires an external magnetic field, the anomalous Hall effect requires only a magnetization, and it was soon realized that ferromagnets display a spontaneous Hall conductivity in the absence of an external magnetic field. The effect has been subsequently observed in a multitude of systems, including transition metals and their oxides, in materials which exhibit colossal magnetoresistance, ferromagnetic semiconductors, topological insulators and a host of other topological materials.

The anomalous Hall effect stems from the fact that, when a current passes through a magnetic material, electrons are predominantly deflected in one direction. This results in an additional current perpendicular to the driving current, which vanishes if the material is non-magnetic. The mechanisms responsible for this deflection have been the subject of substantial controversy ever since Hall's experimental work. Whereas several mechanisms are known to be responsible, the principal actors are united by the spin-orbit interaction-magnetism by itself is usually not sufficient to give rise to an anomalous Hall current. Furthermore, spin-orbit coupling effects are conventionally divided into intrinsic processes, stemming from a material's band structure, and extrinsic processes, related to scattering events. Recent research has shown that intrinsic spin-orbit coupling effects are intertwined with the topological properties of a material's band structure, and that the interplay of intrinsic and extrinsic processes is highly non-trivial. Thus, at the heart of the anomalous Hall effect lie the physical concepts of ferromagnetism and spin-orbit coupling.

Anomalous Hall sensor 100 comprises a Hall cross 110. Hall cross 110 is a specific geometry or layout of a Hall sensor that comprises four terminals 112-1 to 112-4 arranged in a cross-like pattern. A first arm 114-1 of the Hall cross 110 interconnects terminals 112-1 and 112-2 and extends in a first direction (x-direction). A second arm 114-2 of the Hall cross 110 interconnects terminals 112-3 and 112-4 and extends in a second direction (y-direction).

Figure 2:
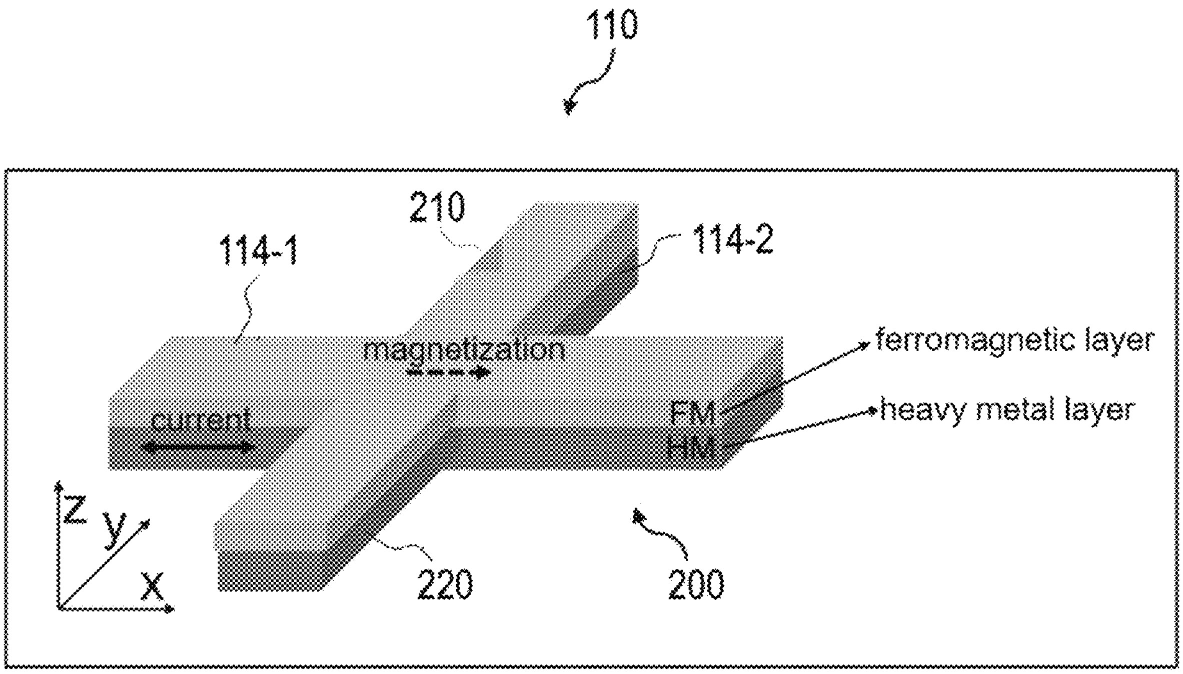
FIG. 2 shows an example of a layered Hall cross, in accordance with implementations of the present disclosure.

As shown in the example of FIG. 2, Hall cross 110 is formed in a layer stack 200 including at least one ferromagnetic layer 210 and one or more further layers 220 for spin-orbit coupling. As the AHE requires a magnetization, ferromagnetic layer 210 may be magnetized in a plane spanned by the first and second direction (e.g., x-y-plane). In the example illustrated in FIG. 2, the magnetization of ferromagnetic layer 210 is in x-direction. For example, a material of ferromagnetic layer 210 may be NiFe or CoFeB. Underneath ferromagnetic layer 210, layer stack 200 comprises a heavy metal layer 220 for spin-orbit coupling. For example, a material of heavy metal layer 220 may be Pt, Ta, Ru, or Pd.

A possible structure of the sensitive element is visible in FIG. 2. It is a Hall cross like structure with a heavy metal layer converting electrical current into a spin polarized current. On top of the heavy metal layer is a ferro magnetic layer, which is polarized in-plane (x-y-plane) (In FIG. 2 drawn in x-direction). As explained above, the structure shown in FIG. 2 is merely an example. Other layers may be possible as well. For example, Hall cross 110 may also comprise a Ta/CoFeB/MgO heterostructure.

Anomalous Hall sensor 100 further comprises a control circuit 120. Control circuit 120 may comprise one or more power supply circuits, clock circuits, measurement circuits, etc. Control circuit 120 is configured to apply current(s) through the first arm 114-1 of the Hall cross 110 (via terminals 112-1 and 112-2) and to cause voltage(s) across the second arm 114-2 of the Hall cross 110 (via terminals 112-3 and 112-4) in response to the current(s) through the first arm 114-1. Control circuit 120 is further configured to apply current(s) through the second arm 114-2 of the Hall cross (via terminals 112-3 and 112-4) and cause voltage(s) across the first arm 114-1 of the Hall cross (via terminals 112-1 and 112-2) in response to the current(s) through the second arm 114-2. Thus, control circuit 120 is configured to apply a spinning current scheme to Hall cross 110.

Anomalous Hall sensor 100 further comprises a processor 130. Processor 130 may comprise one or more analog and/or digital signal processing circuits. Processor 130 is configured to determine a component of an external magnetic field in the z-direction based on the measured voltages in response to the spinning current scheme. In particular, processor 130 may be configured to determine the component of the external magnetic field in the z-direction based on a combination of the measured voltages in response to the spinning current scheme.

Figure 3:
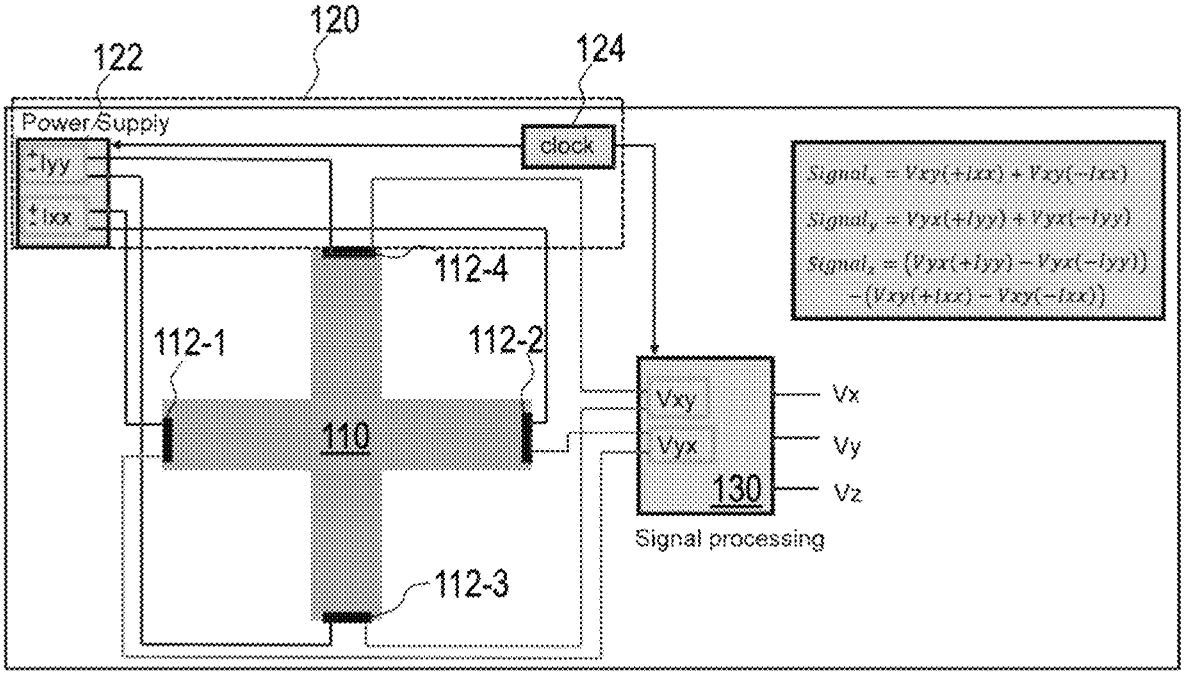
FIG. 3 illustrates an anomalous Hall sensor, in accordance with an implementation of the present disclosure.

FIG. 3 shows an implementation of anomalous Hall sensor 100 and its electronic connections in more detail.

A power supply circuit 122 of control circuit 120 and processor 130 are clocked by a clock circuit 124 of control circuit 120. Power supply circuit 122 is coupled to each of the terminals 112-1 to 112-4 for injecting currents into the first arm 114-1 and the second arm 114-2 of Hall cross 110. Processor 130 is also coupled to each of the terminals 112-1 to 112-4 for measuring resulting (Hall) voltages across the first arm 114-1 and the second arm 114-2 of Hall cross 110.

Power supply circuit 122 is configured to apply a first current +Ixx through the first arm 114-1 of the Hall cross 110. First current +Ixx may be a current from terminal 112-1 to terminal 112-2 in positive x-direction. Processor 130 is configured to measure a first (Hall) voltage Vxy (+Ixx) across the second arm 114-2 (across terminals 112-3 and 112-4) of the Hall cross 110 in response to the first current +Ixx. Power supply circuit 122 is further configured to apply a second current −Ixx opposite to the first current +Ixx through the first arm 114-1 of the Hall cross 110. Second current −Ixx may be a current from terminal 112-2 to terminal 112-1 in negative x-direction. Processor 130 is configured to measure a second (Hall) voltage Vxy (−Ixx) across the second arm 114-2 (across terminals 112-3 and 112-4) of the Hall cross 110 in response to the second current −Ixx. Power supply circuit 122 is further configured to apply a third current +Iyy through the second arm 114-2 of the Hall cross 110. Third current +Iyy may be a current from terminal 112-3 to terminal 112-4 in positive y-direction. Processor 130 is configured to measure a third (Hall) voltage Vyx (+Iyy) across the first arm 114-1 (across terminals 112-1 and 112-2) of the Hall cross 110 in response to the third current +Iyy. Power supply circuit 122 is further configured to apply a fourth current −Iyy opposite to the third current through the second arm 114-2 of the Hall cross 110. Fourth current −Iyy may be a current from terminal 112-4 to terminal 112-3 in negative y-direction. Processor 130 is configured to measure a fourth (Hall) voltage Vyx (−Iyy) across the first arm 114-1 (across terminals 112-1 and 112-2) of the Hall cross 110 in response to the fourth current −Iyy.

The power supply circuit 122 provides the Hall cross 110 with current(s). For this purpose, power supply circuit 122 may comprise current sources. A resulting signal is measured and analyzed in the signal processing unit 130 and given out as a digital or analog signal proportional to each field component (Vx, Vy, Vz). The time control of the supply 122 and the signal processing unit 130 is done via the clock 124. The currents +Ixx and +Iyy may be applied alternately and the corresponding Hall voltages Vxy or Vyx may be recorded. The output signal may be calculated with the formulas in the top right corner in FIG. 3, for example. The voltage is measured via the anomalous Hall effect at the perpendicular arms 114-1, 114-2. Depending in which direction the electric current is applied (Ixx or Iyy), the anomalous Hall voltage is called Vxy for an Ixx current and is called Vyx for an Iyy current (visualized in FIG. 3).

The component of the external magnetic field in z-direction may be determined based on a combination of the four voltages Vxy (+Ixx), Vxy (−Ixx), Vyx (+Iyy), and Vyx (−Iyy). For example, the component of the external magnetic field in z-direction may be proportional to $$Vz=(Vyx(+Iyy)-Vyx(-Iyy))-(Vxy(+Ixx)-Vxy(-Ixx)).$$

The component of the external magnetic field in x-direction may be determined based on a combination of the first voltage Vxy (+Ixx) and the second voltage Vxy (−Ixx). For example, the component of the external magnetic field in x-direction may be proportional to $$Vx=Vxy(+Ixx)+Vxy(-Ixx).$$

The component of the external magnetic field in y-direction may be determined based on a combination of the third voltage third voltage Vyx (+Iyy) and the fourth voltage Vyx (−Iyy). For example, the component of the external magnetic field in y-direction may be proportional to $$Vy=(Vyx(+Iyy)+Vyx(-Iyy).$$

Figure 4:
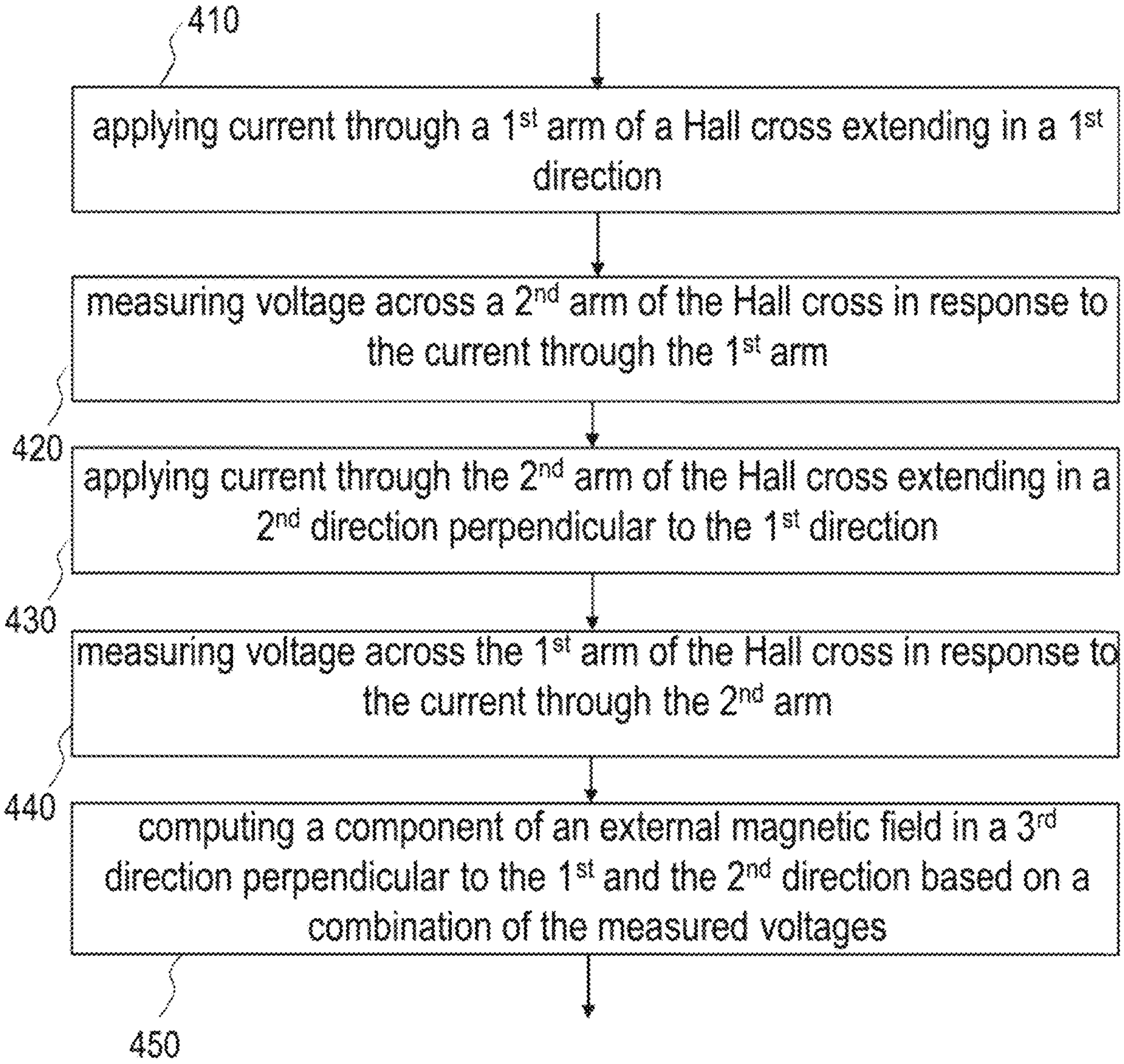
FIG. 4 illustrates a flowchart of an anomalous Hall sensing method, in accordance with implementations of the present disclosure.

Anomalous Hall sensor 100 enables an anomalous Hall sensing method 400, a flowchart of which is shown in FIG. 4.

The method 400 includes applying 410 current(s) through a first arm of a Hall cross extending in a first direction. For example, the first direction may be referred to as x-direction. The method 400 further includes measuring 420 voltage(s) across the second arm of the Hall cross in response to the current(s) through the first arm. The method 400 further includes applying 430 current(s) through the second arm of the Hall cross extending in a second direction perpendicular to the first direction. For example, the second direction may be referred to as y-direction. The method 400 further includes measuring 440 voltage(s) across the first arm of the Hall cross in response to the current(s) through the second arm. Further, the method 400 includes computing 450 a component of an external magnetic field in a third direction perpendicular to the first and the second direction based on a combination of the measured voltages. For example, the third direction may be referred to as z-direction. The measured voltages may also be divided by the respective currents to obtain the respective anomalous Hall resistance.

Figure 5A:
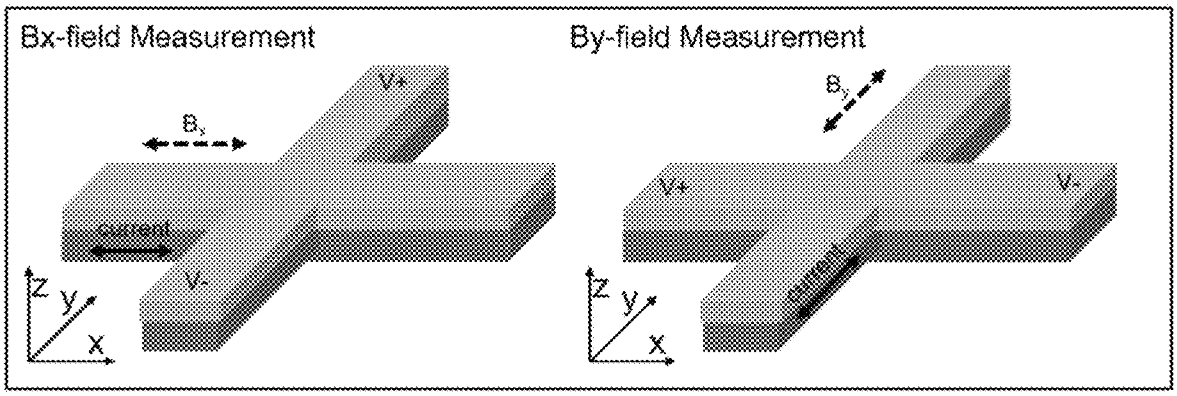
FIG. 5A illustrates a principle of the measurement of in-plane fields, in accordance with implementations of the present disclosure.

The principle of the measurement of in-plane fields via the spin-orbit-torque device is visible in FIG. 5A. For the measurement of an external Bx field, the anomalous Hall voltage V may be measured and the anomalous Hall resistance R may be calculated with the following formula.

$$R=\frac{V}{I}$$

where I is the SOT current. To get rid of the electrical offset of the device, the sign of the SOT current may be switched and the anomalous Hall resistances may be subtracted from each other, like in the following formula.

$$\text{signal}_x=\frac{Vxy}{+Ixx}-\frac{Vxy}{-Ixx}$$

where +/−Ixx is the SOT current in +/−x-direction.

The resistance for the measurement of an external By-field can be calculated in the following formula.

$$\text{signal}_y=\frac{Vyx}{+Iyy}-\frac{Vyx}{-Iyy}$$

where Iyy is the SOT current applied in y-direction.

Figure 5B:
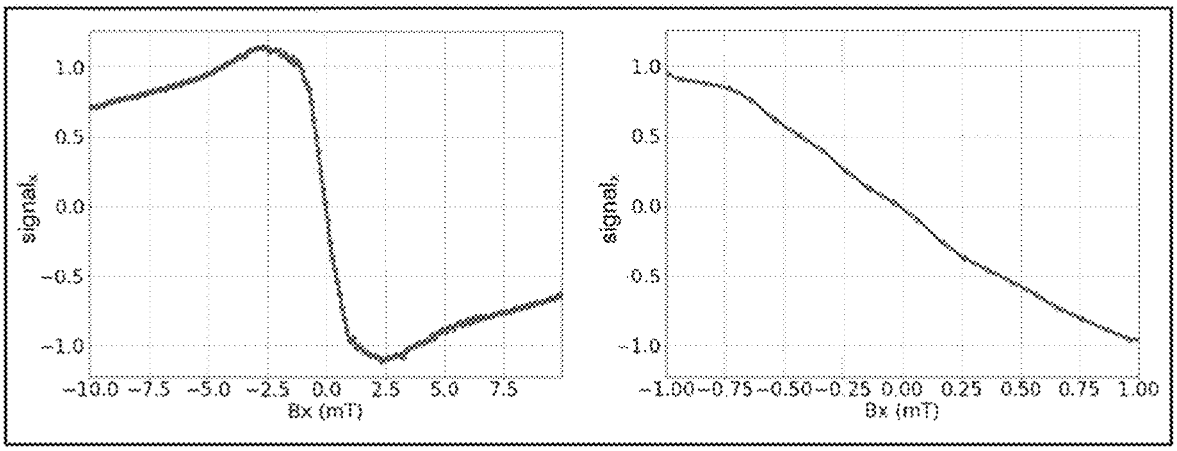
FIG. 5B illustrates a measured external Bx field with a SOT current applied in x-direction and the anomalous Hall voltage measured in y-direction. Offset cancellation got rid of almost all the electrical offset and the linear range is about +/−0.5 mT.

The measured signal of an external Bx field is visible in FIG. 5B. The sensor's response shows almost no offset and a linear range of around +/−0.5 mT.

Figure 6A:
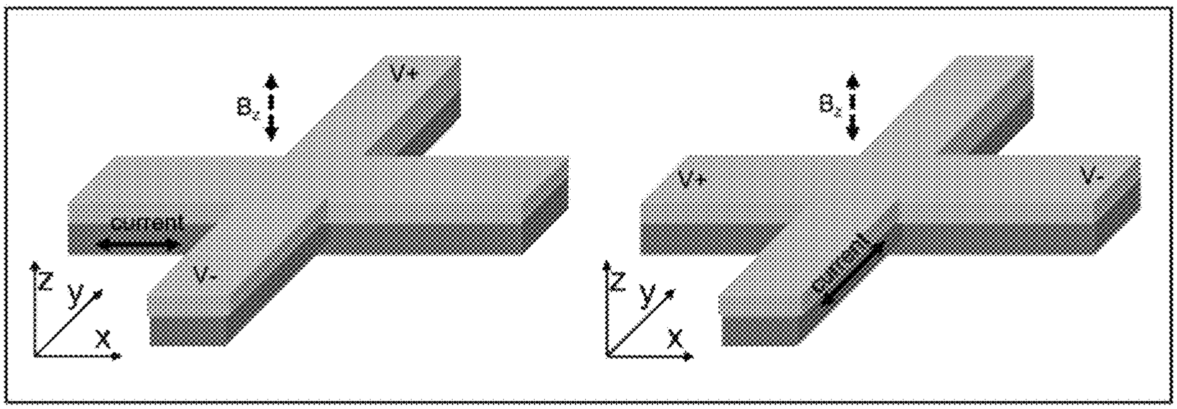
FIG. 6A illustrates a principle of the measurement of the out-of-plane field, in accordance with implementations of the present disclosure.

For the measurement of external fields in z-direction the spinning current technique is utilized. This is visualized in FIG. 6A. The external Bz field is measured via a SOT current applied in the x- and y-direction. In both cases the anomalous Hall voltage is measured.

The formula for the calculation of the signal may look like the following.

$$\text{signal}_z=\left(\frac{Vyx}{+Iyy}+\frac{Vyx}{-Iyy}\right)-\left(\frac{Vxy}{+Ixx}+\frac{Vxy}{-Ixx}\right)$$

Figure 6B:
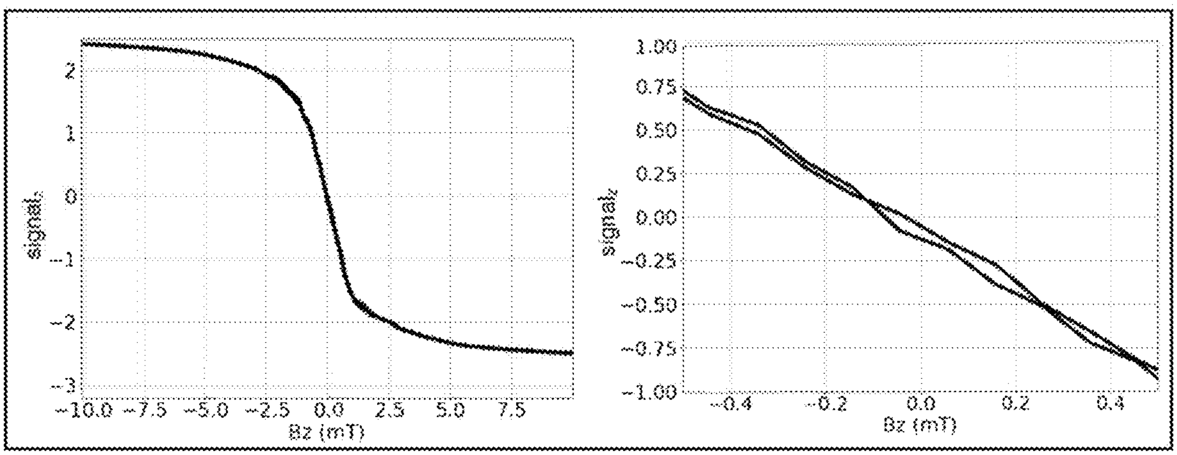
FIG. 6B shows a measured signal of an external Bz field, in accordance with implementations of the present disclosure.

The measured signal is visualized in FIG. 6B.

Figure 7A:
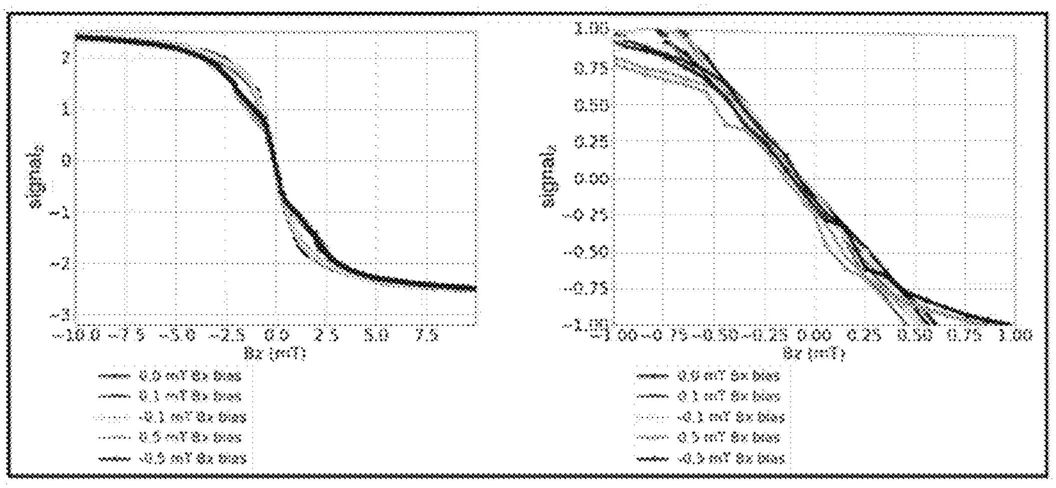
FIG. 7A shows a measured Bz signal for different bias fields, in accordance with implementations of the present disclosure.

The presented sensing principle may stay unaffected regarding bias fields which are in the linear range of the sensing device (+/−0.5 mT). In FIG. 7A the measured Bz signal with different amplitudes for Bx bias fields is visualized. For the higher bias field amplitudes (+/−0.5 mT), the linear range in the sensing direction is decreased. The sensitivity and the offset of the sensor are unaffected by bias fields and stay almost the same.

Figure 7B:
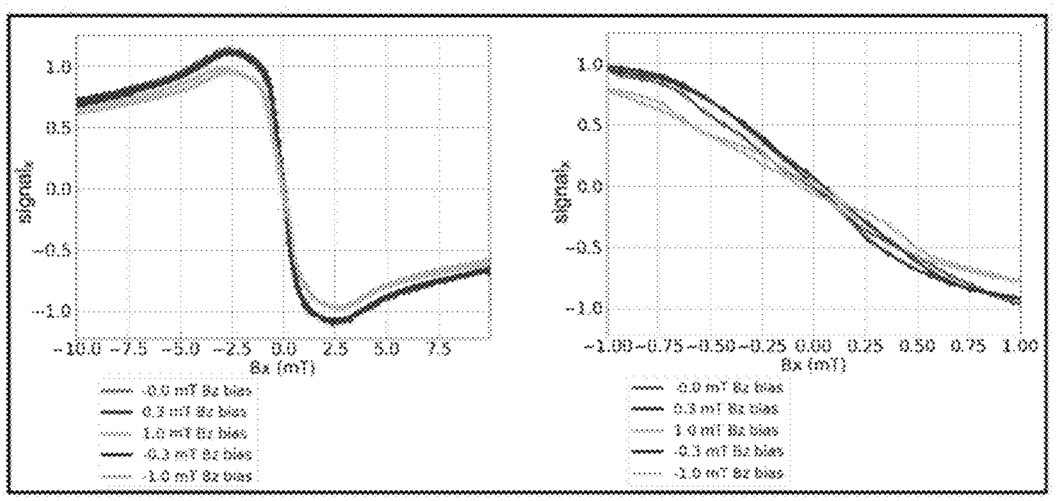
FIG. 7B shows a measured Bx signal with Bz bias fields of various amplitude, in accordance with implementations of the present disclosure.

In FIG. 7B the measured Bx signal with Bz bias fields is visualized. For bias fields within the linear range the sensitivity and the offset are not influenced. But for stronger bias fields the sensitivity gets decreased, which is visible for the measured data with a Bz bias field of 1 mT.

Figure 7C:
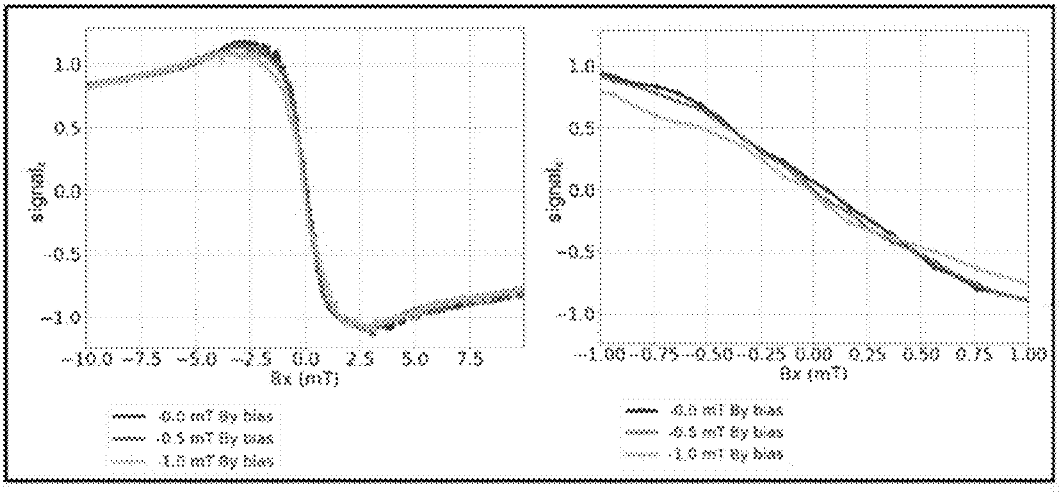
FIG. 7C shows a measured Bx signal with By bias fields of various amplitudes, in accordance with implementations of the present disclosure.

In FIG. 7C the measured Bx signal with different By bias fields is visualized. Again the offset and the sensitivity are unaffected by bias fields within the linear range of the sensor. For the higher bias field of 1 mT the reduction in sensitivity is again visible.

With this the design of a single device 3D magnetic field sensor based on SOT without cross sensitivities and active offset compensation is possible.

According to the present disclosure, the anomalous Hall sensor 100 uses a single domain layer, which may lead to a more reliable functional behavior, since the domain wall does not have to be generated before use. Known 3D sensors do not use the spinning current technique for the z-axis and therefore are not able to cancel offsets in this direction. According to the present disclosure, the spinning current technique is used in the z-direction and the SOT effect is used for x-y field components leading to very small offset in all directions. According to the present disclosure, the magnetization is switched in basically opposing directions due to the SOT current.

According to the present disclosure, a spinning current concept is used for anomalous Hall sensors. In particular, a single device is proposed that can be used to measure magnetic fields in all three directions and compensate the respective offsets. The device employs the spin-orbit-torque (SOT) to rotate the magnetization of a ferro magnetic layer into the sensitive direction of the sensor, which is measured with the anomalous Hall effect (or alternatively another technique that is sensitive to out of plane fields like TMR with an out of plane reference layer). To cancel offsets, the spinning current technique is used, where the SOT current direction is reversed.

With the flipping of the SOT current the offset can be compensated for, but only in the x-y field measurements. For the Bz field measurements, this is not working for only one device. This can be solved by combining the measurements in x and y in such a way to cancel the SOT and offset contributions in the signal. Hence, from the four measurements the field in all three directions can be obtained with active offset compensation.

Some Advantages Are:

Offset Reduction

- No cross sensitivity in other field directions
- Linear range can be tuned by current strength
- An in-plane free layer can be used to detect out of plane fields.
- One sensor device can be used to detect x, y and z field components.

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

The invention claimed is:

1. An anomalous Hall sensor, comprising:
- a Hall cross comprising:
  - a layer stack comprising a ferromagnetic layer,
  - a first arm formed in the layer stack and extending in a first direction, and
  - a second arm formed in the layer stack and extending in a second direction perpendicular to the first direction;
- a control circuit configured to:
  - apply a current through the first arm,
  - measure a voltage across the second arm based on applying the current through the first arm,
  - apply a current through the second arm, and
  - measure a voltage across the first arm based on applying the current through the second arm; and
- a processor configured to:
  - compute, based on a combination of the voltage measured across the first arm and the voltage measured across the second arm, a component of an external magnetic field in a third direction that is perpendicular to the first direction and the second direction.

2. The anomalous Hall sensor of claim 1, wherein, to apply the current through the first arm, the control circuit is configured to:
- apply a first current and a second current through the first arm in opposite directions;
- wherein, to measure the voltage across the second arm, the control circuit is configured to:
  - measure a first voltage and a second voltage across the second arm based on applying the first current and the second current through the first arm;
- wherein, to apply the current through the second arm, the control circuit is configured to:
  - apply a third current and a fourth current through the second arm in opposite directions; and
- wherein, to measure the voltage across the first arm, the control circuit is configured to:
  - measure a third voltage and a fourth voltage across the first arm based on applying the third current and the fourth current through the second arm; and
- wherein, to compute the component of the external magnetic field, the processor is configured to:
  - compute the component of the external magnetic field in the third direction based on a combination of the first voltage, the second voltage, the third voltage, and the fourth voltage.

3. The anomalous Hall sensor of claim 2, wherein the processor is configured to compute a component of the external magnetic field in the first direction based on a combination of the first voltage and the second voltage.

4. The anomalous Hall sensor of claim 3, wherein the processor is configured to compute the component of the external magnetic field in the first direction based on a sum of the first voltage and the second voltage.

5. The anomalous Hall sensor of claim 2, wherein the processor is configured to compute a component of the external magnetic field in the second direction based on a combination of the third voltage and the fourth voltage.

6. The anomalous Hall sensor of claim 5, wherein the processor is configured to compute the component of the external magnetic field in the second direction based on a sum of the third voltage and the fourth voltage.

7. The anomalous Hall sensor of an claim 2, wherein the combination of the first voltage, the second voltage, the third voltage, and the fourth voltage comprises a first difference of the third voltage and the fourth voltage and a second difference of the first voltage and the second voltage.

8. The anomalous Hall sensor of claim 7, wherein the combination of the first voltage, the second voltage, the third voltage, and the fourth voltage corresponds to a difference between the second difference and the first difference.

9. The anomalous Hall sensor of claim 1, wherein the layer stack comprises at least one conductive non-magnetic layer and the ferromagnetic layer.

10. The anomalous Hall sensor of claim 9, wherein the at least one conductive non-magnetic layer comprises a heavy metal layer.

11. The anomalous Hall sensor of claim 1, wherein the layer stack comprises a multilayer composed of a plurality of repetitions of a non-magnetic layer and a magnetic layer.

12. The anomalous Hall sensor of claim 1, wherein the layer stack comprises a multilayer composed of a plurality of repetitions of a first non-magnetic layer, a magnetic layer, and a second non-magnetic layer.

13. The anomalous Hall sensor of claim 11, wherein at least one non-magnetic layer of the plurality of repetitions of the non-magnet layer and the magnet layer is a heavy metal layer.

14. The anomalous Hall sensor of claim 1, wherein the control circuit is configured to apply the current through the first arm and to apply the current through the second arm as spin-polarized currents, respectively.

15. An anomalous Hall sensing method, comprising:
- applying a current through a first arm of a Hall cross, the first arm extending in a first direction;
- measuring a voltage across a second arm of the Hall cross based on applying the current through the first arm;
- applying a current through a second arm of the Hall cross, the second arm extending in a second direction perpendicular to the first direction;
- measuring a voltage across the first arm of the Hall cross based on applying the current through the second arm; and
- computing a component of an external magnetic field in a third direction perpendicular to the first direction and the second direction based on a combination of the voltage measured across the first arm and the voltage measured across the second arm.

16. The anomalous Hall sensing method of claim 15, wherein applying the current through the first arm comprises:
- applying a first current and a second current through the first arm in opposite directions;
- wherein measuring the voltage across the second arm comprises:
  - measuring a first voltage and a second voltage across the second arm based on applying the first current and the second current through the first arm;
- wherein applying the current through the second arm comprises:
  - applying a third current and a fourth current through the second arm in opposite directions; and
- wherein measuring the voltage across the first arm comprises:
  - measuring a third voltage and a fourth voltage across the first arm based on applying the third current and the fourth current through the second arm; and
- wherein computing the component of the external magnetic field comprises:
  - computing the component of the external magnetic field in the third direction based on a combination of the first voltage, the second voltage, the third voltage, and the fourth voltage.

17. The anomalous Hall sensing method of claim 16, further comprising:
- computing a component of the external magnetic field in the first direction based on a combination of the first voltage and the second voltage.

18. The anomalous Hall sensing method of claim 17, wherein computing the component of the external magnetic field in the first direction comprises:
- computing the component of the external magnetic field in the first direction based on a sum of the first voltage and the second voltage.

19. The anomalous Hall sensing method of claim 16, further comprising:
- computing a component of the external magnetic field in the second direction based on a combination of the third voltage and the fourth voltage.

20. The anomalous Hall sensing method of claim 19, wherein computing the component of the external magnetic field in the second direction comprises:
- computing the component of the external magnetic field in the second direction based on a sum of the third voltage and the fourth voltage.

* * * * *